United States Patent [19]
Chang et al.

[11] Patent Number: 5,976,331
[45] Date of Patent: Nov. 2, 1999

[54] ELECTRODEPOSITION APPARATUS FOR COATING WAFERS

[75] Inventors: Chia C. Chang, Berkeley Heights; Robert E. Frahm, Flemington; Orval G. Lorimor, Warren, all of N.J.

[73] Assignee: Lucent Technologies Inc., Murray Hill, N.J.

[21] Appl. No.: 09/070,387

[22] Filed: Apr. 30, 1998

[51] Int. Cl.[6] .................................................. C25D 17/06
[52] U.S. Cl. ................................. 204/224 R; 204/297 R
[58] Field of Search ........................... 204/224 R, 297 R, 204/297 W, 297 M, 271; 205/157

[56] References Cited

U.S. PATENT DOCUMENTS

| | | | |
|---|---|---|---|
| 4,302,316 | 11/1981 | Nester | 204/224 R |
| 5,227,041 | 7/1993 | Brogden et al. | 204/297 R |
| 5,324,410 | 6/1994 | Kummer et al. | 204/297 R X |
| 5,405,518 | 4/1995 | Hsieh et al. | 204/297 R |
| 5,429,733 | 7/1995 | Ishida | 204/224 R |

*Primary Examiner*—Donald R. Valentine

[57] ABSTRACT

An apparatus may be used to deposit metal or conductive layers upon semiconductor wafers using an electrochemical process. The apparatus comprises a housing for retaining a first electrode (e.g., anode) and a second electrode (e.g., cathode), in a fixed spaced-apart relation to each other, with the surface area of the anode exceeding the surface area of the cathode (the wafer). The back surface of the wafer is mounted on a handling disk; the disk has an aperture for accessing the wafer and is held in the housing. A contact probe passes through the aperture to touch the back surface of the wafer, the probe having a spring-loaded spherical radius head for depressurizing the head as it touches the wafer. This apparatus permits a uniform current distribution as the contact probe is not interposed between the electrodes, and the larger surface area of the anode relative to the wafer enhances the production of uniform and reproducible films. The housing may be comprised of at least two separable parts so that access may be readily gained to the inner cavity of the housing, thus enhancing the ease with which the device may be used. The handling disk as well as the spring-loaded probe head reduce the risk of wafer damage.

15 Claims, 6 Drawing Sheets

FIG. 5A
FIG. 5B
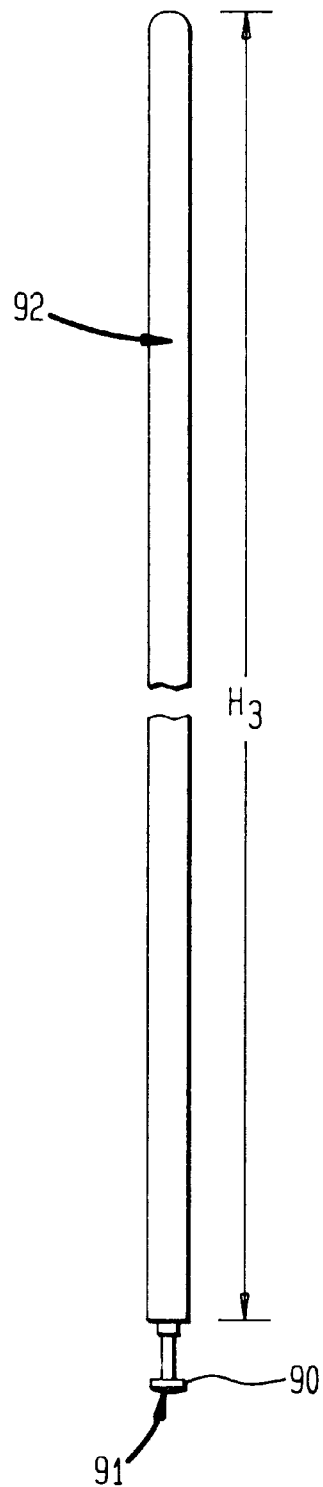
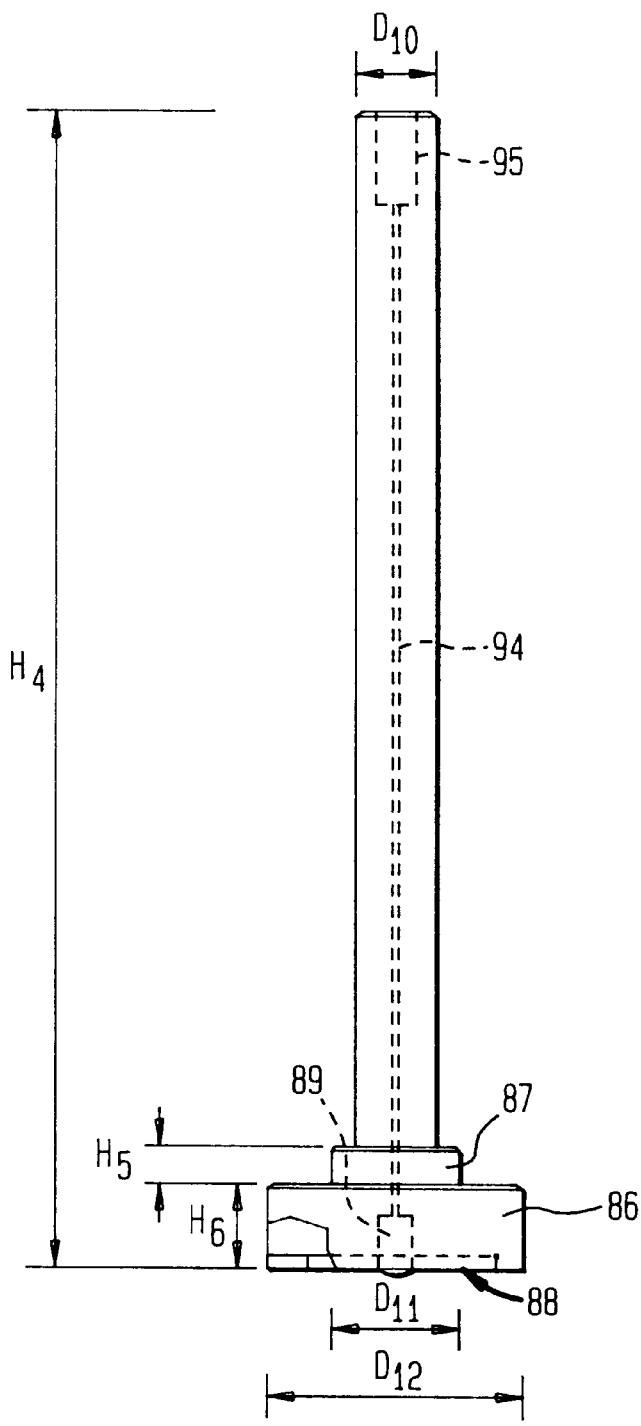

ELECTRODEPOSITION APPARATUS FOR COATING WAFERS

FIELD OF THE INVENTION

The present invention relates to an electrodeposition apparatus and, more particularly, to an apparatus for depositing metal layers such as solder layers upon semiconductor wafers using an electrochemical process.

BACKGROUND OF THE INVENTION

In semiconductor chip assembly, there are many instances in which a layer of metal or conductive material has to be deposited on a wafer. One instance involves the depositing on the wafer of soldering layers which are used to bond parts together. The solder may be placed between a photodetector and a substrate, melted in contact with the two parts, and then resolidified to create a bond between them. The solder is typically comprised of various metal components, such as a eutectic gold and tin solder. To produce high-strength and reliable bonds between the parts—as is required for semiconductor applications—it is important to achieve good uniformity in the thickness and composition of the solder plated on the wafer.

Typically, fabrication of a multi-layered solder on the wafer has been achieved by a plasma vapor deposition (PVD) process, which involves placing the wafers in a reaction chamber and evaporating gold and tin in the chamber. The PVD process is time consuming (in light of the time required to evaporate the metals), and it also is expensive. Much of the gold and tin upon evaporation becomes deposited on the chamber walls, rather than on the wafer, leading to a waste of precious metals which is costly.

Electrochemical deposition of gold and tin or other solder elements onto the wafer has been considered for avoiding the cost and inefficiencies of PVD, as electroplating uses less material than evaporation. Electrodeposition also uses less material than sputtering, another form of metal-layer deposition. However, typical electrodeposition processes are not well-suited for the handling of fragile semiconductor wafers, and they do not provide the uniform layers required for wafer applications. To illustrate, FIG. 1 shows a schematic diagram of a traditional electrodeposition apparatus. The article to be plated, i.e., the wafer 10, defines the cathode of the electrolytic cell 8, and a rod, bar or wire mesh 12, which may be fabricated with the plating metal, is the anode. The wafer 10 may be held within the electrolytic cell 8 with a bracket 14. A contact probe 16 coupled to a current source 18 touches the wafer surface on the side where plating occurs. An electrolyte (not shown) containing ions of the metal to be deposited is placed in the cell, and as current is generated in the cell between the anode and cathode, metallized ions are deposited on the cathode (i.e., the wafer).

There are a number of drawbacks with this conventional cell design as applied to the coating of semiconductor wafers. One of the challenges with electroplating wafers involves providing a good electrical contact to the wafer which has been attempted by having the probe 16 touch the wafer surface. Directly contacting the wafer, however, may cause it to break, crack, or otherwise incur damage. Placing the probe between the wafer surface and the anode (as in FIG. 1), also impedes the deposition of a uniform layer. The probe blocks the deposition of metal at the point where the probe meets the wafer, i.e., at point 10a (FIG. 1), and since the probe 16 is interposed between the cathode 10 and anode 12, it disturbs the current distribution between them. Furthermore, if the probe 16 is not completely sealed from the electrolyte, metal ions may be deposited on the probe, rather than on the wafer. Each of these features reduces the efficiency of the process for electroplating wafers and leads to the production of non-uniform, non-reproducible films.

Thus, it would be advantageous to provide an apparatus for coating wafers via electrochemical deposition which is efficient, produces uniform films, and accommodates the fragile nature of wafers. The invention provides such an apparatus. Further advantages may appear more fully upon considering the description below.

SUMMARY OF THE INVENTION

Summarily described, the invention embraces an electrodeposition apparatus for use in depositing one or more metal or conductive layers (e.g., a solder) on a surface of a semiconductor wafer. The apparatus comprises a housing defining an inner cavity; the housing has a support and a holder for retaining a first electrode and a second electrode, respectively. The electrodes are held in communication with the inner cavity and in fixed spaced-apart relation to each other. Preferably, the back surface of the wafer is mounted on a handling disk, wherein the disk has an aperture for accessing the wafer, and the disk is held in the holder. A source for generating a charge between the electrodes (e.g., a probe) has a tip which contacts the back surface of the wafer.

With the inventive apparatus, the probe does not disturb the current distribution between the electrodes as it is not interposed between them. Also, the surface area of the first electrode may be larger than the surface area of the wafer, which enhances the production of uniform and reproducible films. The housing may be comprised of at least two separable parts, that is, a top housing and a bottom housing, so that access may be readily gained to the inner cavity of the housing, thus enhancing the ease with which the device may be used. The probe may have a spring-loaded head for depressurizing it when contacting the back surface of the wafer which reduces the likelihood of wafer breakage or damage. The handling disk for the wafer further reduces the risk of wafer damage and enhances ease of use.

In a further preferred embodiment, the apparatus comprises a top and bottom housing with a contact assembly supported by the top housing. The contact assembly comprises a contact probe and a contact column having an inner channel for retaining the contact probe. A height adjustment plate may be fixed to the contact column but also adjustable from a first position to a second position along the contact column. The plate has a surface for resting against part of, or a cover to, a container of electrolyte solution; when the plate is fixed to the contact column and rests against the container, the plate may serve to suspend the housing at a desired depth within the solution. This depth may be adjusted by moving the height adjustment plate from the first to the second position.

BRIEF DESCRIPTION OF THE DRAWINGS

For a better understanding of the invention, an exemplary embodiment is described below, considered together with the accompanying drawings in which:

FIGS. 3A–5B show views of particular parts of the apparatus of FIGS. 2A–2B, wherein:

FIG. 3A is a view of the bottom housing looking at its top surface;

FIG. 5A is a side view of the contact assembly probe; and

FIG. 5B is a side view of the contact assembly column.

It is to be understood that these drawings are for the purposes of illustrating the concepts of the invention and are not to scale.

DETAILED DESCRIPTION OF THE INVENTION

The inventive apparatus is particularly useful in depositing solder upon semiconductor wafers, and thus, for purposes of illustration, it will be discussed in connection with such an application, where the wafer defines a cathode of the electrolyte cell. However, it is to be understood that the placing of solder on semiconductor wafers is discussed only for the purpose of illustration, and the present invention may be used for any number of applications that require the deposition of a metal or conductive layer upon a substrate. Also, as is known, the relative positioning of the cathode and anode may be interchanged depending on the application, the electrolyte solution used, and the substrate being coated, such that references to the anode of the device should be understood in appropriate cases recognized by one skilled in the art as interchangeable with references to the cathode, and vice versa.

Figure 1:
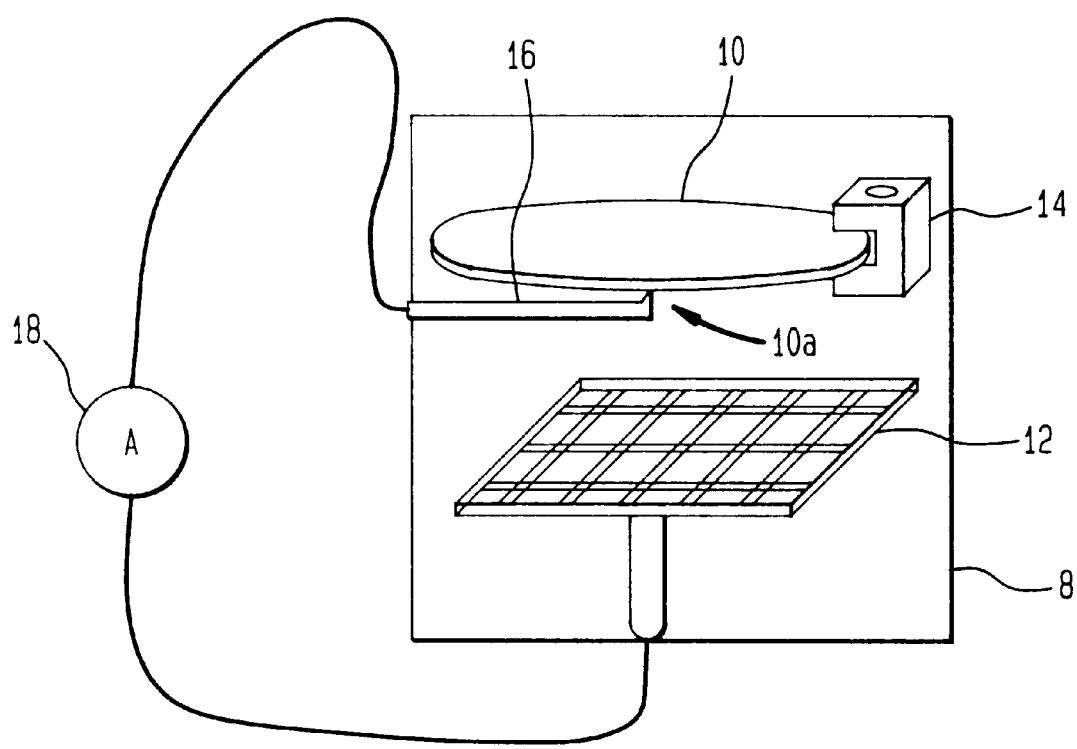
FIG. 1 schematically illustrates a prior art electrodeposition apparatus.
Figure 2A:
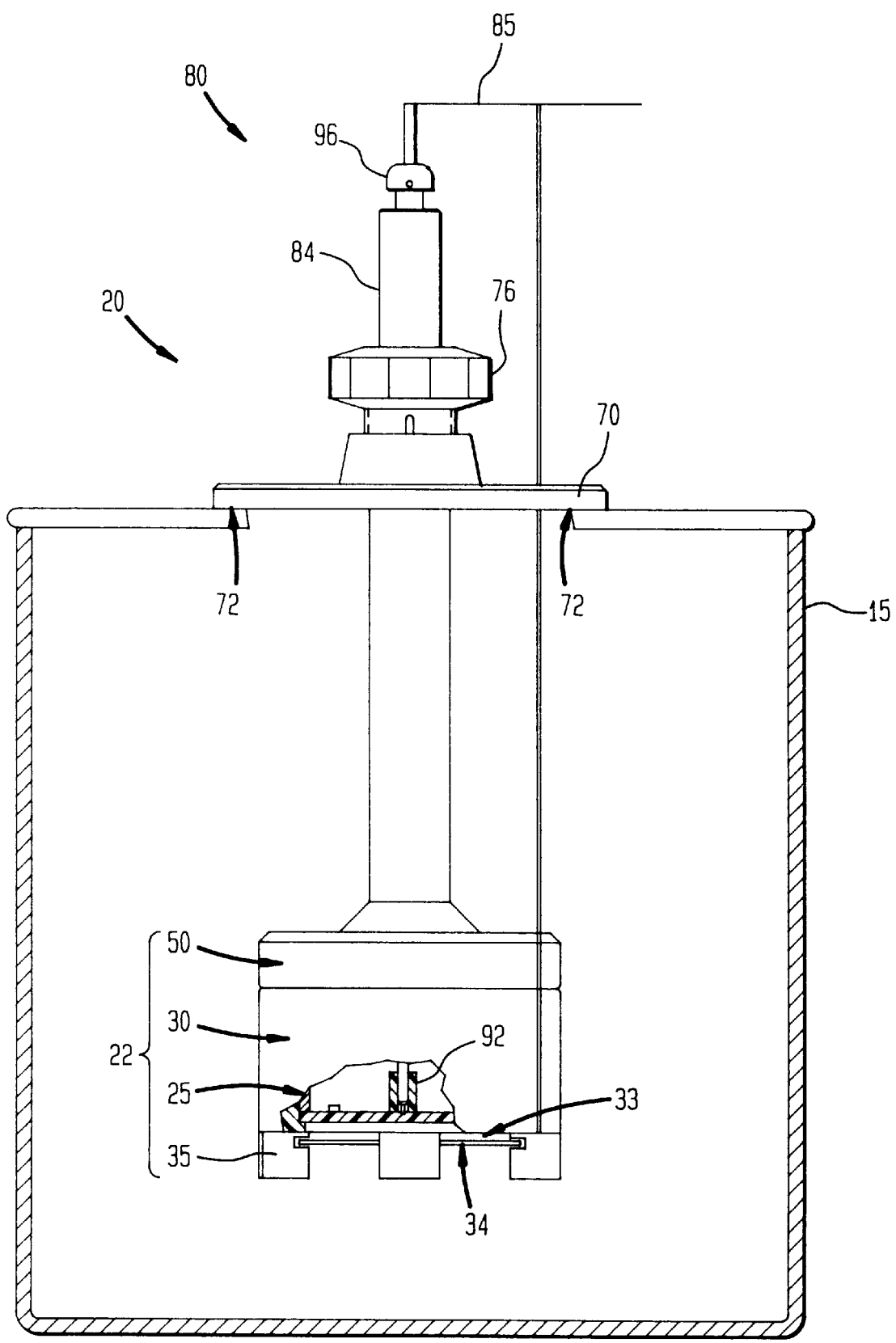
FIG. 2A illustrates a side view of one embodiment of the inventive apparatus in a closed, assembled position, as placed in a beaker, with the beaker shown in a cross-sectional view.
Figure 2B:
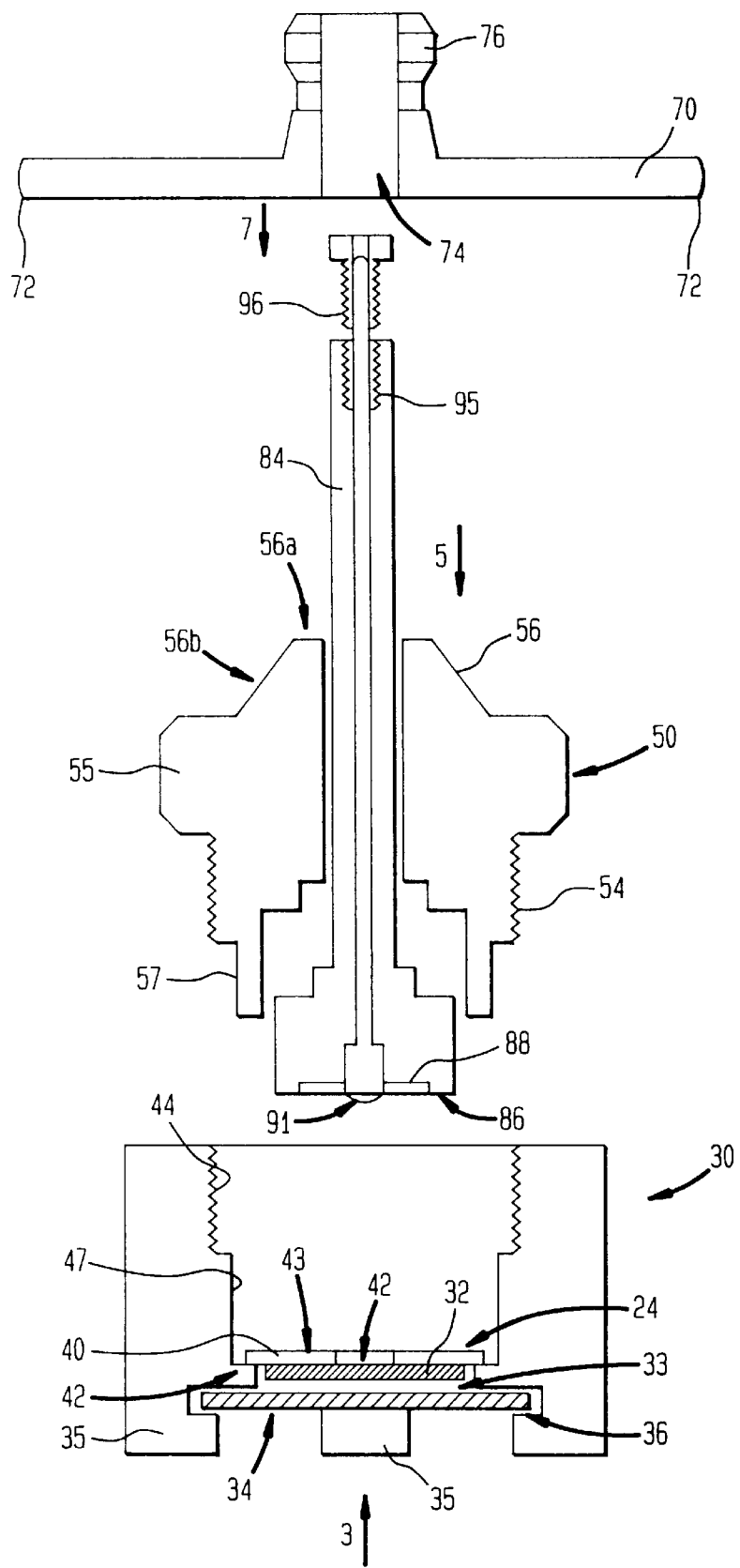
FIG. 2B illustrates a cross-sectional side view of the inventive apparatus of FIG. 2A with its parts in an open, substantially unassembled position.

Referring to FIGS. 2A–2B, there are shown two views of one embodiment of the inventive electrodeposition apparatus 20, FIG. 2A showing the apparatus in an assembled position, and FIG. 2B showing a cross-sectional view of the apparatus in a closed, substantially unassembled position. In FIG. 2A, the wafer or cathode is not shown, which is illustrated in FIG. 2B. This embodiment of the apparatus (e.g., FIGS. 2A–2B), basically comprises a housing 22, a height adjustment plate 70, and a cathodic contact assembly 80. The housing 22 defines an inner cavity 24, and thus, it may be substantially cylindrical in shape, as shown, which is preferable for use of the apparatus with a beaker, although naturally other shapes for the housing may be used as well, e.g., rectangular, square, etc. Preferably, the housing is comprised of two separable parts, that is, a bottom housing 30 and a top housing 50. The top housing may have threads 54 (FIG. 2B), on its exterior for screwing into corresponding threads 44 on the inner cavity of the bottom housing in a ring and nut configuration. In this way, the top and bottom housings can be readily attached and detached by screwing the pieces together and apart. Other attachment means for securing the top and bottom housings may be used as well, for example, use of tongue and groove seals for snap-fitting the parts together, or use of hinged parts with a lock mechanism. Advantageously, the housing is fabricated with TEFLON (a trademark for polytetrafluoroethylene), or another material known in the art having a low level of chemical reactivity with metallic or conductive electrolytes which will surround the housing during the electrodeposition process.

Referring still to the embodiment of FIGS. 2A–2B, a support 36 for retaining the anode 34 is disposed on the housing so that the first electrode or anode 34 is in communication with the inner cavity 24. As shown in FIGS. 2A–2B, the support 36 may comprise a groove or notch placed within each of the feet 35 of the bottom housing. However, other means of suspending the anode within the housing may be used. Similarly, a holder 42 is disposed in the inner cavity of the housing for retaining the wafer 32 or second electrode adjacent the anode. As shown in FIGS. 2A–2B, the holder 42 may comprise an edge or notch defined by the bottom surface of the housing. Again, other holding means beside use of the bottom edge of the housing may be used, as are known, with an important consideration being that the anode and cathode be held in a fixed, spaced-apart relation to each other, that is, a fixed space 33 is present between anode and cathode. Advantageously, the fixed space 33 is as narrow as possible without the two electrodes actually touching, and the two electrodes are held in a substantially parallel, planar position relative to each other, as shown.

Also, as illustrated in FIG. 2B, the circumference of the anode 34 defining its surface area may be larger than the surface area of the cathode 32. Advantageously, the anode may be fabricated with a platinum mesh, and differently-sized meshes may be used. Although the wafer itself is not shown in FIG. 2A, in FIG. 2B it is shown mounted on a circular disk 40. The mounting disk 40 promotes ease of handling of the thin, fragile wafers, and it reduces the likelihood of producing scratches or other damage to the wafer, e.g., one can position the wafer in the housing by handling the disk without contacting the wafer itself. The disk and wafer combination also is sturdier than the wafer alone. The disk is advantageously fabricated with quartz. An aperture 42 is disposed within the center of the disk so that the probe may touch the back surface of the wafer. The wafer may be mounted on the disk by applying a crystal wax on the disk and then laying a wafer on the wax.

There are various features of the inventive apparatus which make it easier to use, less expensive, and more efficient as compared with prior deposition apparatuses, and which also enable the fabrication of more uniform and easily-reproducible films. The use of the two separable parts for the housing, i.e., the bottom housing 30 and top housing 50, make it easy to access the inner cavity of the housing and change the wafer being coated and, if desired, the anode being used. This is particularly the case if both the support 36 and holder 42 are disposed on the bottom housing, while the top housing is used, for example, to support the height adjustment plate 70 and cathodic contact assembly 80. The relatively large anodic area and the fixed electrode spacing 33 promote uniform current distribution and reproducible plating thickness. The mounting disk 40, as noted, both promotes ease of handling and reduces the likelihood of wafer damage.

Further advantages are provided by the height adjustment plate 70 and cathodic contact assembly 80. The contact assembly 80 provides a physical contact between the backside of the cathode (wafer) and the external circuit or current source (not shown). The contact column 84 has outer dimensions corresponding to the inner dimensions of the top housing 50 for fitting within the top housing; it is held by the top and bottom housing when the apparatus is assembled.

The column has an inner channel 94 (FIG. 5B), for retaining an elongated probe or contact guide 92, which may comprise a stainless steel rod. The contact guide 92 is disposed within the contact column 84 and connected to a conductive conduit 85, which runs to the current source (not shown).

Referring to FIGS. 2B, 5A, and 5B, the contact guide 92 may have a tip or head which is spring-loaded to reduce the risk of damaging the wafer upon contact; that is, it may have a spherical or other curved radius head 90 supported by spring pressure for lightly depressurizing against the wafer when the apparatus is assembled. As inserted, the tip 91 of the probe is exposed from the column 84 (FIGS. 2B and 5A–5B). Also, contact column 84 has at one of its ends two circular flat promontories, an upper promontory 87 and a lower promontory 86, the lower promontory having a substantially planar bottom surface or face, in which is held an o-ring 88. The planar face of the lower promontory 86 rests against the quartz disk 40 (FIG. 2B), and the o-ring 88 seals the contact probe when assembled, so that during operation the electrolyte will be prevented from leaking to the probe tip 91.

This embodiment of the apparatus further comprises a height adjustment plate 70 (FIGS. 2A–2B), which is helpful for positioning the apparatus in an electrolyte container or beaker. In FIG. 2A, the apparatus is shown placed in a beaker 15 for holding the electrolyte solution; the beaker is shown as a cross-section with diagonal shading. A cutaway, cross-sectional view 25 within the bottom housing 30 is also shown in FIG. 2A with diagonal shading, to illustrate the relationship of the inner apparatus features, although the remaining features of FIG. 2A are shown with a side view. As shown in FIG. 2A, the edges 72 of the plate 70 can rest against a portion of, or cover to, the beaker 15. With the plate 70 firmly secured to the contact column 84, the column along with the remainder of the apparatus may be suspended at a selected depth within the beaker, as can be seen in FIG. 2A. Referring to FIG. 2B, the plate 70 has an inner bore 74 corresponding substantially to the dimensions of the exterior of the contact column 84 so that the plate 70 can be placed on, and surround, the contact column 84. A locknut 76 is used to tighten the plate around the column for securing it at a fixed vertical height relative to the column. As the locknut 76 is released, the plate 70 can be moved to a new vertical position on the column so that the apparatus can be moved to a new depth within the beaker.

This embodiment of the apparatus may be assembled and used as follows, as illustrated in FIG. 2B. The anode 34 and disk-supported wafer 32 are placed in the bottom housing. The contact guide or probe 92 is inserted into the channel 94 of the column 84 (e.g., in the direction of arrow "3"), so that the tip 91 protrudes from the bottom surface 86 of the column. The probe 92 is secured within the column by use of a screw 96 placed over the probe and threaded into the column, the top of the column channel 94 having threads 95 for receiving the screw. The top housing 50 is then slid over the column, following, for example, arrow "5" of FIG. 2B. The top housing 50 with the attached contact assembly 84 is then screwed into the corresponding threads of the bottom housing, so that the projecting tip 91 of the probe may pass through the aperture 42 of the quartz disk to contact the back surface of the wafer. The apparatus, e.g., the top and bottom housings and contact assembly, may be secured together not only by the threads of the housings 44, 54, but also, the face of the lower promontory 86 of the contact column may rest against the top surface of the quartz disk 43. The top housing may have an inner sleeve 57 projecting downwardly from the threaded portion 54 for fitting within an inner seat area 47 of the housing, for further securing the parts together.

With this configuration, a good contact is secured between the cathodic contact and the back of the wafer. The height adjustment plate 70 may be slid over the contact column 84, e.g., following arrow "7," and the apparatus 20 placed in a beaker 15 or other container with an electrolyte solution. The electrolyte may be selected based on principles known in the field, which naturally will depend upon the layer or layers sought to be deposited on the wafer. The plate 70 may be adjusted along the column so that the apparatus is suspended within a desired position in the electrolyte. The source for generating current (not shown), may then be activated so that a current is generated at the back surface of the wafer, where the probe tip 91 touches the wafer surface, thus generating a current between the cathode and the anode. The cell of this invention is easy to assemble and fit for production application; it repeatedly provides good electrical contact to thin and fragile wafer samples; and it ensures uniform and reproducible current distribution over the complete area of the wafer.

Figure 3A:
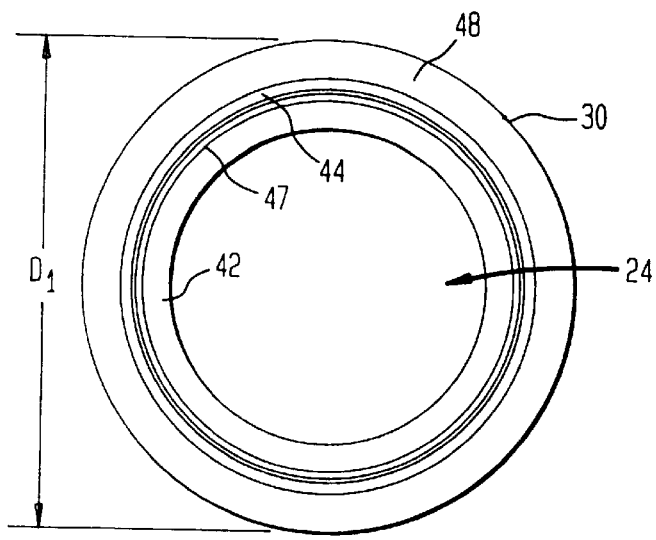
Figure 3B:
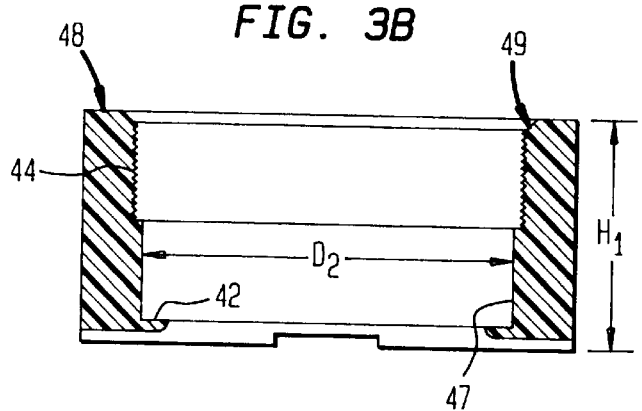
FIG. 3B is a cross-sectional side view of the bottom housing.
Figure 3C:
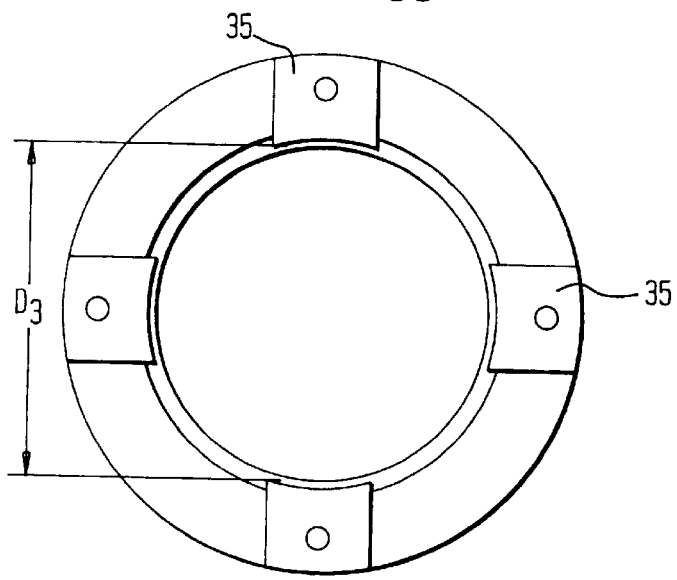
FIG. 3C is a view of the bottom housing looking at its bottom surface in the direction of arrow "3" of FIG. 2B.

FIGS. 3A–5B show views of selected parts of the apparatus of FIGS. 2A–2B. FIG. 3A shows a top view of the bottom housing, FIG. 3B shows a cross-sectional side view, and FIG. 3C shows a bottom view, looking in the direction of arrow "3" of FIG. 2B. As can be seen in these figures, the sidewall of the bottom housing varies in diameter to define its various features, e.g., it has a bottom surface 42 or notch for suspending the disk-mounted wafer; an inner seat wall 47 defining a small diameter region for surrounding the sleeve 57 of the top housing; a threaded wall 44 for receiving the threaded portion of the top housing 54; and a top surface 48. A beveled edge 49 may bridge the top surface 48 and the threaded portion 54 (FIG. 3B), and a plurality of feet (four shown, FIG. 3C), may be placed on the bottom, e.g., for when the apparatus is placed on a surface.

Naturally, the dimensions of the apparatus features will depend on the size of the wafers. Also, since the parts interconnect, changing the dimensions of one part may require that a change be made to another part. Nevertheless, exemplary dimensions that may be used to fabricate one embodiment of the apparatus for use in depositing solder layers upon semiconductor wafers of less than two inches in diameter are described below with reference to FIGS. 3A–5B. In particular, looking at FIGS. 3A–3C, the outermost diameter of the bottom housing $D_1$ may be about 2.75 inches; the diameter $D_2$ disposed between the seat wall 47 may be about 2.004 inches; and the innermost diameter defining the open area between the cathode and anode $D_3$ may be about 1.800 inches. The height $H_1$ may be about 1.193 inches.

Figure 4A:
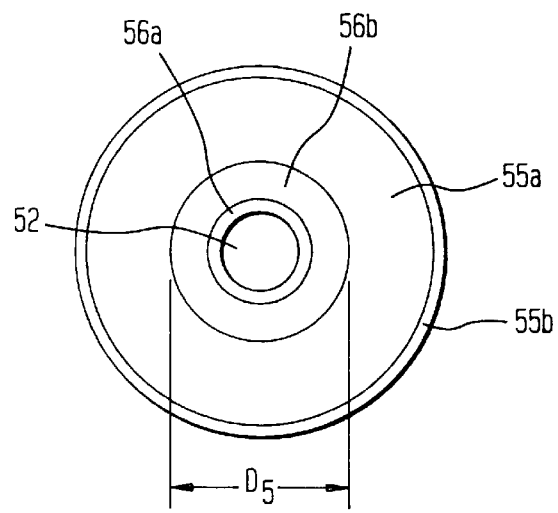
FIG. 4A is a view of the top housing looking at its top surface in the direction of arrow "5" of FIG. 2B.
Figure 4B:
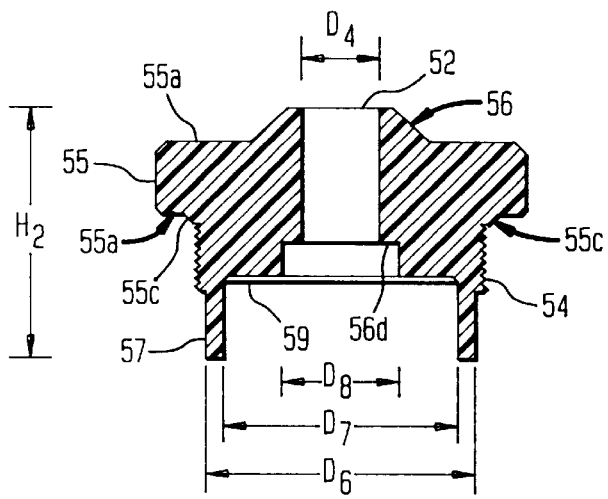
FIG. 4B is a cross-sectional side view of the top housing.
Figure 4C:
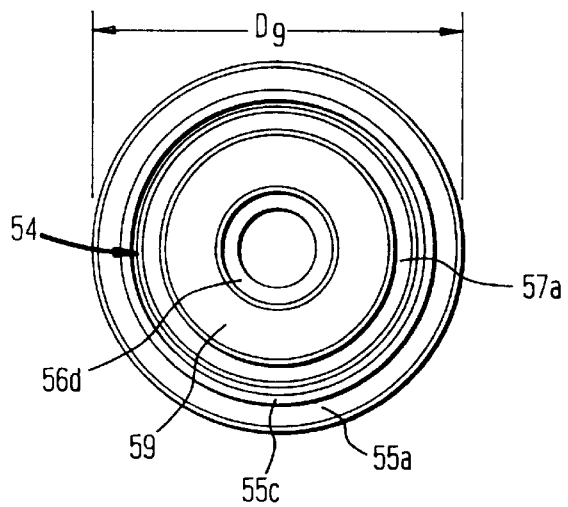
FIG. 4C is a bottom view of the top housing.

Referring to FIGS. 4A–4C, there likewise is shown a top view (FIG. 4A), of the top housing, looking in the direction of arrow "5" of FIG. 2B; a cross-sectional side view (FIG. 4B); and a bottom view (FIG. 4C). As one may see more clearly in these figures, the top housing may have an inner hole 52 to allow for the passing of the contact column through it, the hole advantageously having a diameter $D_4$ of about 0.563 inches, e.g., when the contact column has an outer diameter of about 0.561 inches (FIG. 5B). The top housing may have an upper dome region 56 and outwardly protruding handle portion 55, so that the dome region 56 can fit snugly against the contact column 84 while the handle portion 55 allows a user to easily grab the top housing and screw it onto or off of the bottom housing. The dimensions of the top housing are varied to correspond to the dimensions of the inner side wall of the bottom housing to fit snugly within it, and also, to fit snugly over the contact column 84.

FIG. 4A shows four levels for the top surface of the top housing, e.g., a top edge 56*a* encircling the top of the upper dome region 56; a slanted, side wall 56b defining the dome region; a flat surface 55a defining the width to the handle portion 55, and a beveled edge 55b bridging the top and side of the handle portion. At its widest section, the width of the dome region $D_5$ (FIG. 4A), may be about 1.300 inches. Referring to FIGS. 4B and 4C, the underside of the handle portion 55 may have a chamfered area 55c bridging the threaded side 54 and the handle 55. The sleeve 57 (FIG. 4B), extends downwardly from the threaded section 54, as previously described, having a bottom sleeve surface 57a (FIG. 4C). The interior of the top housing may correspond in dimension to two promontories 86, 87 of the contact column (FIG. 5B), with a bottom dome surface 56d, and a bottom handle surface 59.

FIG. 4C, the bottom view, shows six separate levels of features, i.e., the underside of the dome 56d for covering the top of the upper promontory 87 of the contact column; the underside of the handle 59 for covering the top of the lower promontory 86 of the column (FIG. 5B); the underside of the sleeve 57a which surrounds the lower promontory 86; the threaded side 54 for screwing onto the bottom housing; the chamfered area 55c which aids in the snug fit between the top and bottom housings; and the flat surface 55a of the handle portion 55. Given the previous dimensions for the bottom housing, the height $H_2$ of the top housing may be about 1.649 inches; the outer width $D_6$ of the sleeve may be about 1.994 inches; the inner width $D_7$ of the sleeve may be about 1.750 inches; and the width $D_8$ for covering the upper promontory 87 of the column may be about 0.887 inches. The total width of the top housing $D_9$ preferably may be about 2.70 inches, corresponding essentially to the width of the bottom housing (i.e., above $D_1$~2.75 inches).

FIGS. 5A and 5B show side views of the contact probe 92 and contact column 84, respectively, wherein in FIG. 5B, the inner channel 94 for retaining the probe, as well as the threaded section 95 for receiving the probe screw 96, is shown with hatched lines. Given the dimensions described above for the housings, the probe may have a height $H_3$ of about 9.06 inches, with the total height of the column $H_4$ being about 8.295 inches, so that the probe will protrude above the column when inserted in the channel 94. The probe 92 may comprise a 0.093 diameter stainless steel rod. With regard to the column itself, this may have a width $D_{10}$ of about 0.561 inches. The column may have an upper promontory 87 with a width $D_{11}$ of about 0.875 inches and a height $H_5$ of about 0.270 inches; and a lower promontory 86 with a width $D_{12}$ of about 1.738 inches (slightly smaller than the diameter of the sleeve, FIG. 4B), and a height $H_6$ of about 0.625 inches. The slot 89 for passage of the tip of the contact guide to press fit against the wafer advantageously may be about 0.375 inches deep and about 0.100 inches in diameter. Given these dimensions, the parts may be constructed so that they fit well together to provide a secure and easily assembled electrodeposition apparatus for the coating of wafers.

It is understood that the embodiments described herein are merely exemplary and that a person skilled in the art may make variations and modifications without departing from the spirit and scope of the invention. For example, the invention is discussed primarily with regard to the depositing of solder on semiconductor wafers but as noted above, it may be used with or without modifications for any application involving the electroplating of a substrate. All such variations and modifications are intended to be included within the scope of the appended claims.

We claim:

1. An electrodeposition apparatus for use in depositing one or more metal or conductive layers on a front surface of a semiconductor wafer, the apparatus comprising:

a housing defining an inner cavity, a support for retaining a first electrode in communication with the inner cavity, and a holder adapted to retain the wafer in the inner cavity in fixed spaced-apart relation to the first electrode; and a probe for conducting a charge between electrodes, the probe having a tip and being configured so that when the wafer is placed in the holder with its front surface facing the first electrode, the tip of the probe contacts the back surface of the wafer.

2. The apparatus of claim 1, in which the support is sized to receive an electrode having a surface area larger than the holder is sized to receive such that the surface area of the first electrode disposed in the support may exceed the surface area of the wafer disposed in the holder for promoting the deposition of uniform layers of metal or conductive material on the wafer.

3. The apparatus of claim 2, in which the housing is comprised of at least two separable parts comprising a top housing and a bottom housing so that access may be gained to the inner cavity of the housing by separating the parts, the support for retaining the first electrode being disposed on the bottom housing.

4. The apparatus of claim 3, in which the bottom housing has an interior surface, and the holder and support each comprise one or more edges or notches on the interior surface of the bottom housing.

5. The apparatus of claim 3, further comprising a disk having an aperture therethrough so that the back surface of the wafer may be mounted on the disk with the aperture permitting for the passing of the probe tip therethrough to the back surface of the wafer.

6. The apparatus of claim 5, in which the probe has a spring-loaded spherical radius head defining the tip for depressurizing the tip against the back surface of the wafer.

7. The apparatus of claim 6, further comprising a contact column configured to be supported by the top housing, the contact column having an inner channel for retaining the probe.

8. The apparatus of claim 7, further comprising a height adjustment plate attached to the contact column and movable from at least a first position to at least a second position along the contact column, the height adjustment plate having a surface for resting against a container or covering to a container so that the contact column and top housing supported on the contact column may be disposed at a desired position within the container by moving the height adjustment plate from the first position to the at least second position.

9. The apparatus of claim 8, further comprising a ringed seal disposed around the head of the probe, between the probe and the contact column.

10. The apparatus of claim 5, in which the housing is fabricated with polytetrafluoroethylene, the anode is fabricated with platinum mesh, and the disk is fabricated with quartz.

11. The apparatus of claim 1, in which the first electrode comprises an anode, and the wafer when placed in the holder is adapted to comprise a cathode.

12. An electrodeposition apparatus for coating a front surface of a semiconductor wafer with one or more layers of metal or conductive material, the apparatus comprising a first electrode for placement in a container adapted to receive electrolyte solution, the apparatus comprising:

a disk having an aperture therethrough and a surface adapted for the mounting of the back surface of the wafer thereon;

at least one housing for holding the disk in a fixed, spaced-apart position relative to the first electrode and being configured so that when the back surface of the wafer is mounted on the disk, the front surface of the wafer faces the first electrode, and, a contact assembly adapted to be secured to the housing for supporting a means for conducting a charge to the wafer, the contact assembly comprising a contact probe having a spring-loaded head for passing through the aperture to contact the back surface of the wafer.

13. The apparatus of claim 12, in which the at least one housing comprises a top housing and a bottom housing, wherein the top housing has an inner hole and the contact assembly further comprises a column removably secured within the inner hole of the top housing in a substantially vertical position relative to the top housing, the column having an inner channel for retaining the contact probe therein.

14. The apparatus of claim 13, further comprising a height adjustment plate attached to the contact column and movable from at least a first position to a second position along the contact column, the height adjustment plate having a surface for resting against a rim of or covering to a container so that when the contact column and top housing secured thereto are disposed within the container the position of the contact column and top housing within the container may be adjusted by moving the height adjustment plate from the first position to the second position.

15. An electrodeposition apparatus for use in depositing one or more metal or conductive layers on a front surface of a semiconductor wafer, the apparatus comprising:

a top housing, a bottom housing, a height adjustment plate, and a cathodic contact assembly comprising a column, wherein the top and bottom housings are removably attachable to each other, the column is configured to be removably suspended within the top housing, and the height adjustment plated is removably attachable to the column of the contact assembly, the column having an inner channel for insertion of a contact probe therein;

the top housing and bottom housing each have an inner surface defining an inner cavity when the top and bottom housings are secured together;

the bottom housing has a support on its inner surface for retaining an anode in communication with the inner cavity and a holder on its inner surface for retaining a disk in fixed spaced-apart relation to the anode, the disk being adapted for mounting the back surface of the wafer thereon and having an aperture therethrough to allow for contacting the back surface of the wafer, the wafer adapted to define a cathode, wherein the support and holder are configured such that the anode and disk are held in a substantially parallel position relative to each other;

the top housing has an inner hole for the passing of the column and probe therethrough so that the probe may pass through the aperture in the disk to contact the back surface of the wafer and provide a charge thereto, the probe has a spring-loaded head for depressurizing the head as it contacts the back surface of the wafer; and the height adjustment plate is attachable to the contact column and movable from at least a first position to a second position along the contact column, the plate having a surface for resting against a container to suspend the top and bottom housings at a desired position within the container, wherein the position of the top and bottom housings within the container may be adjusted by moving the height adjustment plate from the first position to the second position.

* * * * *